United States Patent
Tsang et al.

(10) Patent No.: US 8,130,127 B1
(45) Date of Patent: Mar. 6, 2012

(54) DISCRETE-TIME DELTA-SIGMA MODULATOR WITH IMPROVED ANTI-ALIASING AT LOWER QUANTIZATION RATES

(75) Inventors: Robin Matthew Tsang, Austin, TX (US); John Christopher Tucker, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 69 days.

(21) Appl. No.: 12/827,522

(22) Filed: Jun. 30, 2010

(51) Int. Cl.
  *H03M 3/00* (2006.01)
(52) U.S. Cl. .................................... 341/143; 341/155
(58) Field of Classification Search .................. 341/143, 341/144, 145, 61, 172
  See application file for complete search history.

(56) References Cited

U.S. PATENT DOCUMENTS

| | | | |
|---|---|---|---|
| 6,469,650 B2 | 10/2002 | Nanda et al. | |
| 6,738,004 B2 | 5/2004 | Melanson | |
| 6,992,509 B2 | 1/2006 | Ko et al. | |
| 7,193,549 B1 | 3/2007 | Nanda et al. | |
| 7,365,667 B1 | 4/2008 | Nanda et al. | |
| 7,439,893 B2 * | 10/2008 | Inukai et al. | 341/143 |
| 7,439,897 B1 * | 10/2008 | Gorin et al. | 341/155 |
| 7,450,045 B2 * | 11/2008 | Liu | 341/143 |
| 7,551,022 B2 * | 6/2009 | Arknæs-Pedersen et al. | 330/10 |
| 7,961,126 B2 * | 6/2011 | Deval et al. | 341/131 |
| 8,031,094 B2 * | 10/2011 | Hotelling et al. | 341/143 |

OTHER PUBLICATIONS

Koh, et al.,"A 66dB DR, 1.2V, 1.2mW, Single Amplifier Double-Sampling 2nd-order Sigma-Delta ADC for WCDMA in 90nm CMOS", ISSCC, Feb. 10, 2005, San Francisco CA.
Robert, et al., "A Second-Order High-Resolution Incremental A/D Converter with Offset and Charge Injection Compensation", IEEE JSSC, vol. 23, No. 3, Jun. 1988.
Quinquempoix, et al., "A Low-Power 22-bit Incremental ADC with 4ppm INL, 2ppm Gain Error and 2uV DC Offset", Proceedings of ESSCIRC, Grenoble, FR 2005.
Cirrus 5361 Datasheet, Cirrus Logic Inc,, Feb. 2005.

* cited by examiner

*Primary Examiner* — Peguy Jean Pierre
(74) *Attorney, Agent, or Firm* — Andrew M. Harris; Mitch Harris, Atty at Law, LLC (57) ABSTRACT

A discrete time delta-sigma modulator circuit, which may be used to implement an analog-to-digital converter (ADC) provides improved anti-aliasing performance when lower quantization rates are selected, by maintaining the clocking rate of a first stage in the delta-sigma modulator loop filter at a rate higher than would ordinarily be selected for a lower quantization rate. To accomplish the anti-aliasing improvement, the ratio between the quantization rate and the clocking rate of the first integrator is reduced at the lower quantization rate, resulting in a first true alias image at a multiple of the quantization rate, permitting anti-aliasing filters to more effectively attenuate the alias image, and attenuating the images spaced at the quantization rate via the averaging operation of the first integrator.

22 Claims, 7 Drawing Sheets

DISCRETE-TIME DELTA-SIGMA MODULATOR WITH IMPROVED ANTI-ALIASING AT LOWER QUANTIZATION RATES

BACKGROUND OF THE INVENTION

1. Field of the Invention

The present invention relates generally to delta-sigma modulation circuits, and more specifically, to a discrete-time delta-sigma analog-to-digital converter having a selectable quantization rate and a ratio between the quantization rate and the sampling rate of the first loop filter stage that is changed with the selectable quantization rate.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

For discrete-time delta-sigma modulators in which the digital output rate is selectable, analog anti-aliasing filters that attenuate the input signal at higher image frequencies must typically also be selectable and for lower frequencies of operation, can require large components. Since the sampling rate of the discrete-time integrators employed in the loop filter of the delta-sigma modulator is typically the same as the quantization rate, the aliased images of the input signal occur at a frequency spacing equal to the quantization rate of the delta-sigma modulator. Therefore, when the quantization rate is changed, the anti-aliasing filter must also be changed or the signal-to-noise ratio of the modulator is dramatically compromised if unwanted signal energy exists around multiples of the frequency of the new quantization rate. For example, a discrete time delta-sigma ADC operating at a sampling rate of 3 MHz may require attenuation of the first aliased image, which starts at 3 MHz, by 60 dB in order to meet performance requirements. If a lower quantization rate, for example 500 kHz is then applied, the first alias image occurs at 500 kHz. An exemplary first-order analog resistor-capacitor (RC) anti-aliasing filter has a roll-off slope of 20 dB/decade. Therefore, such an anti-aliasing filter that attenuates a first image at 3 Mhz by 60 dB would yield an attenuation of only 44.5 dB at 500 kHz. Therefore, the corner frequency of the input anti-aliasing filter must typically be adjusted along with the converter quantization rate when the quantization rate is selectable.

However, assuming, for example, that the ADC is an audio ADC having a flat passband from 0 Hz to 20 kHz, providing such an anti-aliasing filter with a 60 dB attenuation at 500 kHz would require a more complex higher-order filter, which requires more power, more circuit area and presents problems with tuning/process variation. Further, since lower quantization rates in an ADC are generally selected to conserve power, such as in battery-operated audio devices under certain conditions, the addition of complex anti-aliasing filters is even more undesirable and may result in no net power savings. Further, in general, as the corner frequency of an internal RC anti-aliasing filter is reduced, the size of the components needed to implement the filter increases, thereby consuming more die area.

Therefore, it would be desirable to provide a delta-sigma modulator that has a selectable quantization rate without the typical consequent reduction in anti-aliasing performance, nor an increase in die area required to implement an internal anti-aliasing filter.

SUMMARY OF THE INVENTION

The present invention includes a discrete-time delta-sigma modulator circuit and its method of operation. The delta-sigma modulator circuit may be included within an analog-to-digital converter (ADC).

The delta-sigma modulator has a selectable quantization rate. The first stage of the loop filter is a discrete-time integrator that is operated according to a separate selectable clock that has a sampling clock rate that differs, at least in one operating mode, from the quantization rate. When a lower quantization rate is selected, the ratio of the sampling clock rate to the quantization clock rate is changed, so that the first integrator averages the input signal of the delta-sigma modulator over multiple sampling periods per quantization clock period, thereby attenuating the aliased images of the input signal. The response of the loop filter to the input signal is also changed with the selection of the quantization rate, so that the operation of the delta-sigma modulator is not substantially affected by the relatively higher sampling rate of the first integrator, which may be accomplished by changing the input sampling capacitance or feedback capacitance of the first integrator to reduce the charge transferred per sampling clock period, or voltage rise per charge quanta at the output of the integrator, when the lower quantization rate is selected.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus in the form of a delta-sigma type analog-to-digital converter in which the clock rate of the converter can be decreased to conserve power, without requiring a consequent lowering of the analog anti-aliasing filter corner frequency in order to preserve stability of the delta-sigma modulator and/or the noise floor of the ADC converter output.

Figure 1:
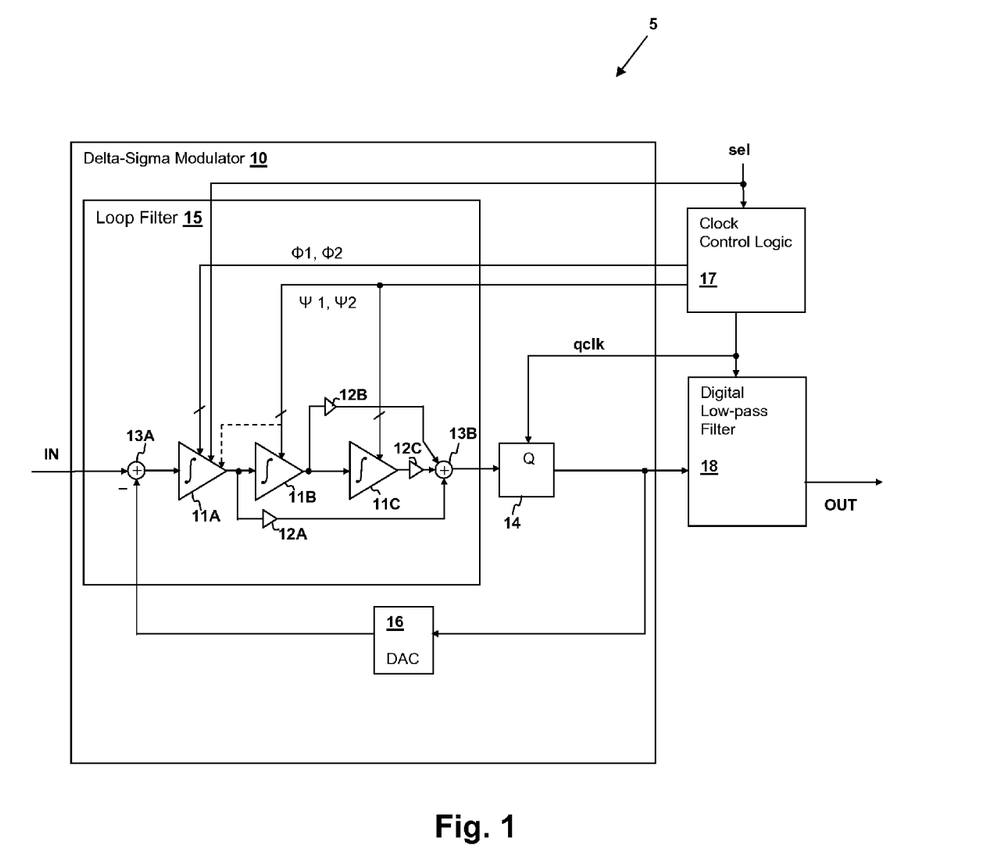
FIG. 1 is a block diagram depicting an ADC 5 in accordance with an embodiment of the present invention.

Referring now to FIG. 1, an analog-to-digital converter (ADC) 5 in accordance with an embodiment of the present invention is shown. An analog input signal IN is provided to a delta-sigma modulator 10. Delta-sigma modulator 10 provides a digital output OUT containing quantization noise and having a time-average value representing analog input signal IN. A digital low pass filter 18 provides digital output OUT of ADC 5 by filtering the output of delta-sigma modulator 10. Clock control logic 17 supplies clock signals and control signals to delta-sigma modulator 10 and a digital low pass filter 18.

Analog loop filter 15 is a discrete-time feed-forward third-order loop filter design, implemented by switched-capacitor integrators. The depicted analog loop filter 15 is only exemplary, and it is understood that loop filters of different order of both feedback and feed-forward types can be implemented using the techniques of the present invention. Within analog loop filter 15, a series of cascaded integrators 11A-11C receive analog input signal IN at a input of a first integrator stage 11A. Analog loop filter 15 receives feedback at a summer 13A from a digital-to-analog converter (DAC) 16 that converts the output of quantizer 14 to an analog value. As will be described below, in the depicted embodiments, the functions of DAC 16 and summer 13A are implemented by switched capacitors that apply reference voltages as feedback to loop filter 15 according to the value of the output of quantizer 14. The output of quantizer 14 is also supplied to digital low-pass filter 18, which attenuates the quantization noise introduced by delta-sigma modulator 10.

A set of feed-forward signal paths are provided through scalers 12A-12C and are summed by a summer 13B that provides an analog input to quantizer 14. In practice, scalers 12A-12C and summer 13B are implemented using switched-capacitor techniques. When a clock signal qclk is applied to quantizer 14, the feedback signal provided by DAC 16 closes the loop around delta-sigma modulator 10, enforcing the condition that the time-average output of quantizer 14 represents the selected input signal.

Clock control logic 17 in ADC 5, provides the quantizer clock signal qclk to quantizer 14 and to digital low pass filter 18. Clock control logic 17 additionally provides clock phase signals $\Phi 1$ and $\Phi 2$ to integrator 11A of loop filter 15 and clock phase signals $\Psi 1$ and $\Psi 2$ to integrators 11B and 11C of loop filter 15. Clock control logic 17 selects different output rates of delta-sigma modulator 10 according to a control signal sel provided to ADC 5, which may be provided from an internal register, through an external pin, or by another technique suitable for programmatic or manual selection of a quantization rate of delta-sigma modulator 10. Control signal sel may be a multi-bit signal having more than two states or may be a single bit signal selecting between two different quantization rates of delta-sigma modulator 10. Responsive to the state of control signal sel, in the exemplary embodiment, clock control logic 17 generates clock phase signals $\Psi 1$ and $\Psi 2$ at a rate equal to the selected quantization rate. For example, clock phase signals $\Psi 1$ and $\Psi 2$ may have a rate of 3 MHz in a higher-power low distortion mode (control signal sel=1), and a rate of 500 kHz in a lower-power mode (control signal sel=0). While it is possible that clock phase signals $\Psi 1$ and $\Psi 2$ may be generated at a higher multiple of the quantization rate, for the most power-efficient performance, clock phase signals $\Psi 1$ and $\Psi 2$ are generally generated at the same rate as quantizer clock signal qclk.

In traditional delta-sigma modulator based ADCs having switched-capacitor integrators, when the quantization clock is changed, the sampling rate of the entire loop filter is also changed, maintaining the same ratio between the quantization rate and the sampling rate of the loop filter integrators. In the present invention, clock control logic 17 generates clock phase signals $\Phi 1$ and $\Phi 2$ such that the sampling rate of integrator 11A is not reduced by the same factor as quantizer clock signal qclk, increasing the ratio between the sampling rate of at least the first integrator 11A of analog loop filter 15 and quantizer clock signal qclk. Thus, in the depicted embodiment, the sampling rate of integrators 11B and 11C will differ from the relatively higher sampling rate of integrator 11A, at least in the lower power lower-sampling-rate operating mode as selected by control signal sel. For example, in the depicted embodiment, when control signal sel=0, quantizer clock qclk and clock phase signals $\Psi 1$ and $\Psi 2$ are generated at 500 kHz, but clock phase signals $\Phi 1$ and $\Phi 2$ are generated at 2 MHz. When control signal sel=1, quantizer clock qclk and all of clock phase signals $\Phi 1$, $\Phi 2$, $\Psi 1$ and $\Psi 2$ are generated at 3 MHz in the depicted embodiment. Thus, the ratio between the sampling rate of integrator 11A and the quantization rate is unity when control signal sel=1, but the ratio is 4 when control signal sel=0.

By arranging to clock delta-sigma modulator 10 as described above, the quantizer and following digital logic such as digital low pass filter 18, can be clocked at a lower rate to reduce power requirements in a lower power operating mode, but without requiring that an anti-aliasing filter used to filter analog input signal IN be changed. Since integrator 11A samples analog input signal IN at 2 MHz instead of 500 kHz, the first alias image of the baseband of analog input signal IN at the output of integrator 11A is at 2 MHz rather than 500 kHz. Integrator 11B does generate alias images at 500 kHz, but due to the averaging provided by integrator 11A, those images are effectively attenuated below the levels that would substantially affect the performance of ADC 5.

Figures 2A, 2B:
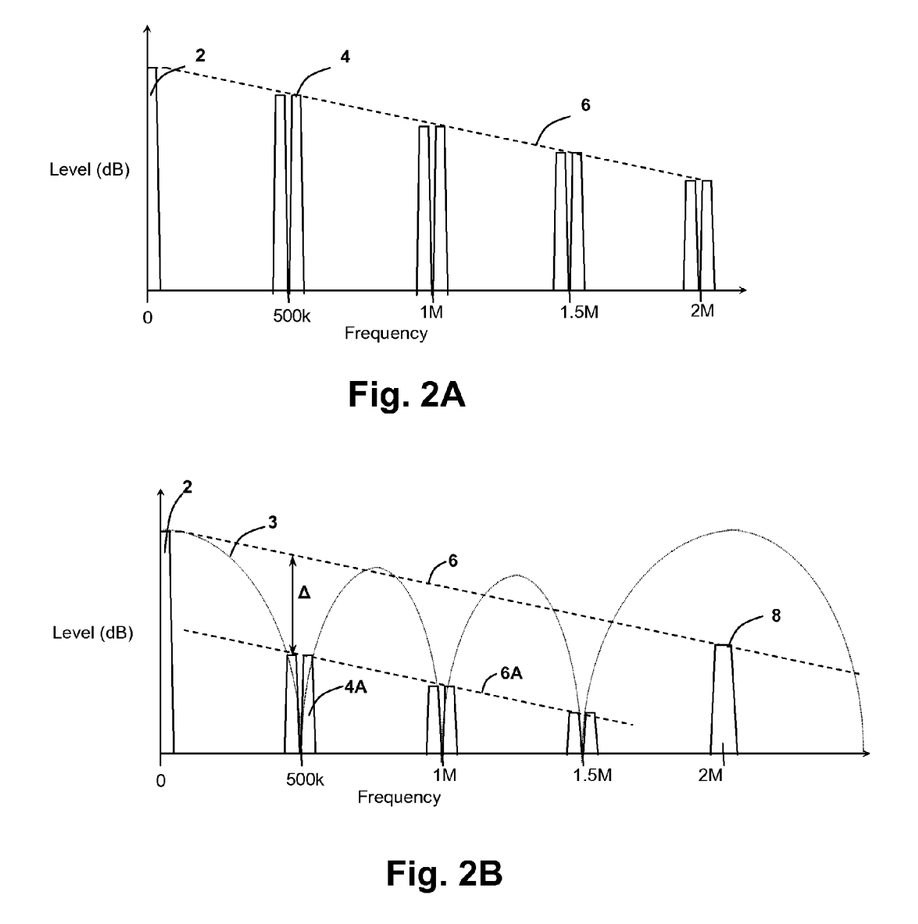
FIG. 2A and FIG. 2B are graphs illustrating performance of ADC 5.

Referring now to FIG. 2A and FIG. 2B, the above described performance improvement for the low quantization rate mode (sel=0) in ADC 5 is illustrated. FIG. 2A shows the performance of an ADC in which the loop filter integrators are operated at a quantization rate of 500 kHz. Since the integrators are sampling the input signal at 500 kHz, the baseband information 2 is aliased at first image 4 at 500 kHz and subsequent aliased images at 1 MHz, 1.5 MHz and 2 MHz, as shown, continuing indefinitely. The energy in the aliased images 4 decreases with frequency due to anti-aliasing filter attenuation 6, and eventually due to finite bandwidth of the loop filter circuits. FIG. 2A illustrates that while an aliased image at a high quantization rate (e.g., above 2 MHz) might be acceptable, the presence of the mostly un-attenuated aliased image 4 at 500 kHz is not, as the amplitude of aliased image 4 is almost equal to that of baseband 2 information.

FIG. 2B illustrates the improvement provided by the different sampling rate/quantization rate ratio in ADC 5, when the low quantization rate mode (sel=0) in ADC 5 is selected. The first true aliased image 8 occurs at 2 MHz, since integrator 11A generates an alias at that frequency. Since anti-aliasing filter attenuation 6 is substantial at 2 MHz, aliased image 8 is sufficiently attenuated so as not to substantially disrupt operation of ADC 5. Other aliased images 4A and those occurring at 1 MHz and 1.5 MHz are attenuated by the averaging provided by integrator 11A, which integrates four samples for every quantization period. The frequency response 3 of a rectangular window (equal-weighted) averaging operation is shown in FIG. 2B, and yields a minimum attenuation of 42 dB across an audio bandwidth of 20 kHz, which is illustrated as attenuation value Δ. Attenuation value Δ, combines with additional attenuation provided by anti-aliasing filter attenuation 6A, further reducing the impact of alias images 4A on the operation of ADC 5. Comparing FIG. 2A to FIG. 2B, it is clear that a significant improvement in the attenuation of aliased images is achieved by operating first integrator 11A at a higher sampling rate when the quantization rate is lowered for a fixed anti-aliasing filter response.

Figure 3:
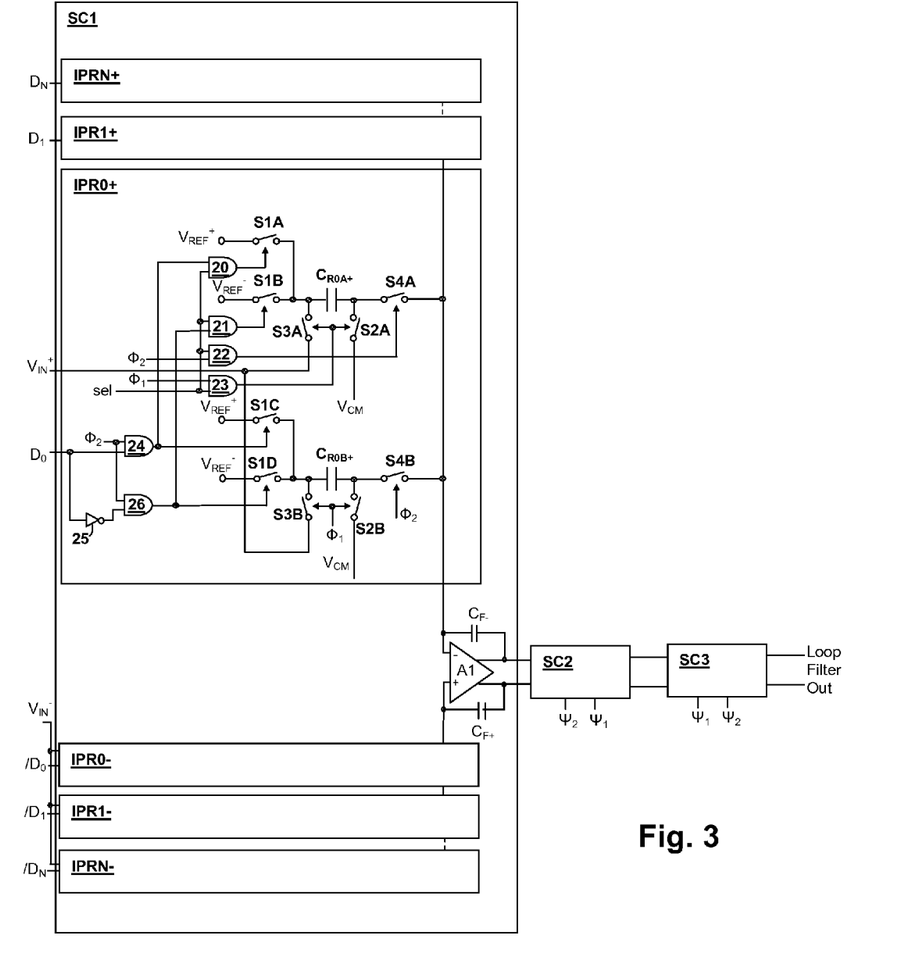
FIG. 3 is a simplified schematic diagram depicting circuits that can be used to implement loop filter 15 of FIG. 1 in accordance with an embodiment of the present invention.

Referring now to FIG. 3, circuits that may be used to implement analog loop filter 15 in accordance with an embodiment of the present invention are shown. A first switched-capacitor integrator SC1 that is operated by clock phase signals Φ1 and Φ2, is followed by two additional switched-capacitor integrators SC2 and SC3 that are operated by clock phase signals Ψ1 and Ψ2. As described above, in the exemplary embodiment clock phase signals Ψ1 and Ψ2 are generated at the quantization rate of delta-sigma modulator 10, while clock phase signals Φ1 and Φ2 have a selectable rate.

Switched-capacitor integrator SC1 is implemented by an operational amplifier A1 having feeback capacitors $C_{F-}$ and $C_{F+}$ coupled between corresponding differential outputs and differential inputs of operational amplifier A1. A set of input/reference circuits IPR0+ through IPRN+ provide input to the inverting input of operational amplifier A1 from a non-inverted polarity input signal $V_{IN+}$. One of input/reference circuits IPR0+ through IPRN+ corresponds to each digital feedback signal $D_0$-$D_N$ provided from a decode of the output of quantizer 14, which in the exemplary embodiment have equal weights. A corresponding set of input/reference circuits IPR0− through IPRN− is coupled to the non-inverting input of amplifier A1 and receives an inverted polarity input signal $V_{IN-}$ and inverted versions /$D_0$-/$D_N$ of digital feedback signals $D_0$-$D_N$. Since the internal details of input/reference circuits IPR0+ through IPRN+ and IPR0− through IPRN− are identical, only the details of input/reference circuit IPR0+ are illustrated.

Input/reference circuit IPR0+ includes two switched-capacitor circuits having different capacitances selected according to the relative clock rates of clock phase signals Φ1 and Φ2 in the two illustrative operating modes. When the quantization rate is decreased by clock control logic 17, integrator 11A operates at 2 MHz rather than the quantization rate of 500 kHz, and four samples of input signals $V_{IN+}$,$V_{IN-}$ are collected during each quantization period. Therefore, unless the amount of charge injected into feedback capacitors $C_{F-}$ and $C_{F+}$ associated with each sample is reduced when operating in the lower quantization rate mode (sel=0), the gain of switched-capacitor SC1 will be multiplied by four and delta-sigma modulator 10 will not operate as expected.

To reduce the amount of charge injected, control signal sel is provided to logical-AND gates 20-23 to disable the application of clock phase signals Φ1 and Φ2 to the switched-capacitor input circuit formed by switches S1A, S1B, S2A, S3A and S4A that apply charge accumulated from input signal $V_{IN+}$ onto a capacitor $C_{ROA+}$ during the period when clock phase Φ1 is active and dump the accumulated charge plus or minus an effective reference charge supplied from reference voltage $V_{REF+}$ or $V_{REF-}$ onto feedback capacitor $C_{F-}$. Another switching circuit formed by switches S1C, S1D, S2B, S3B and S4B, similarly dump charge accumulated from input signal $V_{IN+}$ onto a capacitor $C_{ROB+}$ during the period when clock phase Φ1 is active plus or minus an effective reference charge supplied from reference voltage $V_{REF+}$ or $V_{REF-}$ onto feedback capacitor $C_{F-}$. However, switches S1C, S1D, S2B, S3B and S4B are not disabled when control signal sel selects the lower quantization rate mode, and remain active during all modes.

Capacitor $C_{ROA+}$ has a capacitance value three times that of capacitor $C_{ROB+}$, so that when control signal sel is set to the higher quantization rate mode (sel=1), the capacitance of capacitor $C_{ROA+}$ acting in parallel with the capacitance of capacitor $C_{ROB+}$ yields an input switched capacitance that is four times the input switched capacitance in the higher quantization rate mode than the input switched capacitance in the lower quantization rate mode, which is provided only by capacitor $C_{ROB+}$. The selection of the value of input sampling capacitance accomplishes the goal of reducing the gain of switched-capacitor integrator SC1 when collecting multiple samples per quantization clock period in the lower quantization rate mode (sel=0).

Logical-AND gates 24 and 26, along with inverter 25 provide a selector that selectively applies clock phase signal Φ2 to only one of switches S1A or S1B and to only one of switches S1C or S1D. The selector selects application of one of reference voltage $V_{REF+}$ or $V_{REF-}$ that is applied to a terminal of capacitor $C_{ROA+}$ and capacitor $C_{ROB+}$ according to the state of digital feedback value $D_0$. Input reference circuit IPR0+, along with other input reference circuits IPR1+ through IPRN+ and IPR0− through IPRN− thereby provide the function of DAC 16 by applying a reference charge selected by the combination of bits $D_0$-$D_N$ that represent a decode of the output of quantizer 14. However, it is not a requirement of the present invention that the input and feedback circuits be combined, as will be illustrated below with reference to FIG. 4 and FIG. 5.

Figure 4:
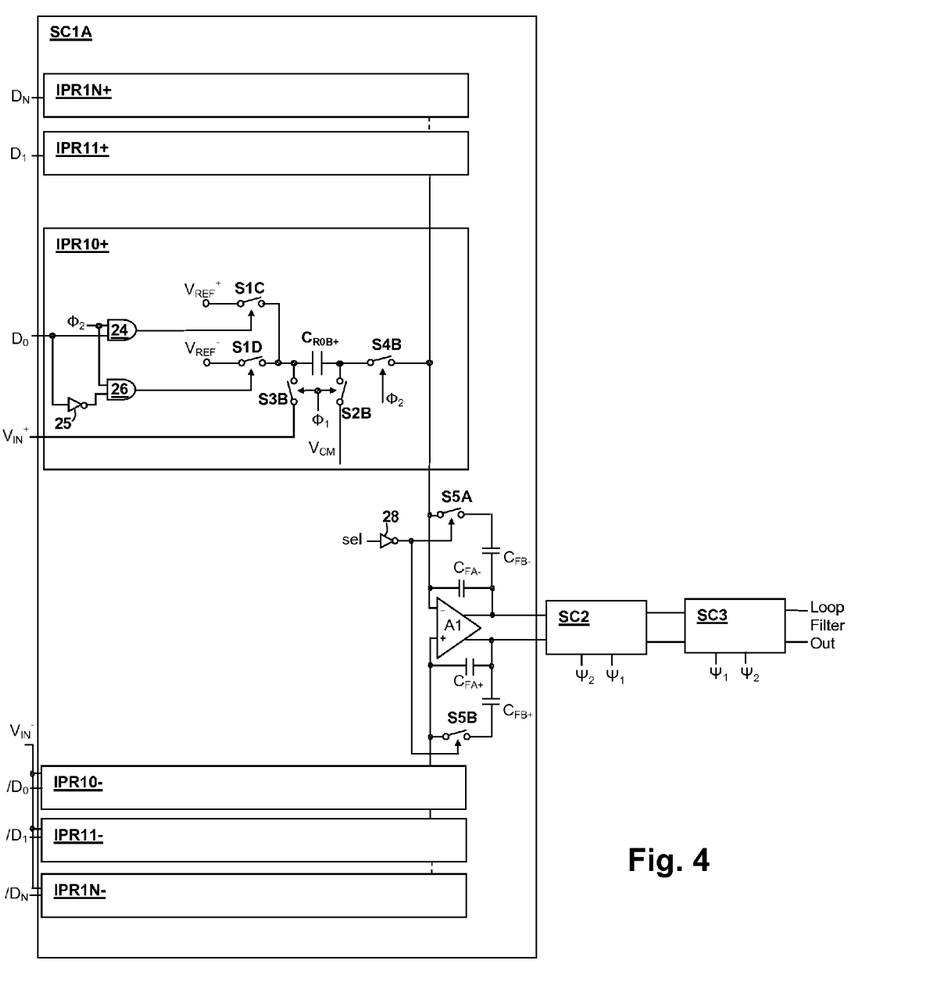
FIG. 4 is a simplified schematic diagram depicting circuits that can be used to implement loop filter 15 of FIG. 1 in accordance with another embodiment of the present invention.

Referring now to FIG. 4, circuits that may be used to implement analog loop filter 15 in accordance with another embodiment of the present invention are shown. First switched-capacitor integrator SC1A is similar to switched-capacitor integrator SC1 of FIG. 3, so only differences between them will be described below. In switched-capacitor integrator SC1A, rather than selecting a smaller input sampling and reference capacitance in the lower quantization rate mode (sel=0), in first switched-capacitor integrator SC1A, the feedback capacitance connected around amplifier A1 is selectable. Input reference circuit IPR1O+, along with other input reference circuits IPR11+ through IPR1N+ and IPR10− through IPR1N− are identical and apply charge from the corresponding one of input signals $V_{IN+}$,$V_{IN-}$ and reference feedback as in the circuits of FIG. 3, except that input capacitance $C_{ROB+}$ that samples the input and applies the feedback reference has a fixed value.

Feedback capacitors $C_{FA-}$ and $C_{FA+}$ are connected between corresponding inputs and outputs of amplifier A1, and feedback capacitors $C_{FB-}$ and $C_{FB}$, which in the exemplary embodiment have a capacitance value thrice that of feedback capacitors $C_{FA-}$ and $C_{FA+}$, are coupled between the corresponding inputs and outputs of amplifier A1 by switches S5A and S5B, which are closed in the lower quantization rate mode (sel=0) by an inverted selection signal provided by an inverter 28. When control signal sel is de-asserted, the resulting increase in the total feedback capacitance of switched-capacitor integrator SC1A lowers the output voltage to input charge response of switched-capacitor integrator SC1A by a factor of four, producing the same scaling as provided by the selection of the input sampling capacitance in switched-capacitor integrator SC1 of FIG. 3. Whether the input sampling capacitance is selected or the feedback capacitance is selected can be decided based on particular design constraints, as each technique has its advantages. Since the feedback capacitance is generally much larger than the input sampling capacitance in a switched-capacitor circuit, a selectable feedback capacitance can require more die area. However, when the size of the input sampling capacitor needed in the higher quantization rate mode for a particular design is so small that fabrication limits are being approached and/or parasitic circuit effects begin to introduce significant error, then rather than reducing the input sampling capacitor as in integrator SC1 of FIG. 3, the technique depicted in FIG. 4 may be applied. Further, a combination of the circuits of FIG. 3 and FIG. 4 may be implemented so that both the input sampling capacitance and feedback capacitance are selectable. For example, the input capacitance may be reduced by a factor of two and the feedback capacitance may be increased by a factor of two in the lower quantization rate mode, yielding the same scaling of the first integrator response as is obtained by dividing the input sampling capacitance by four or quadrupling the feedback capacitor size.

Figure 5:
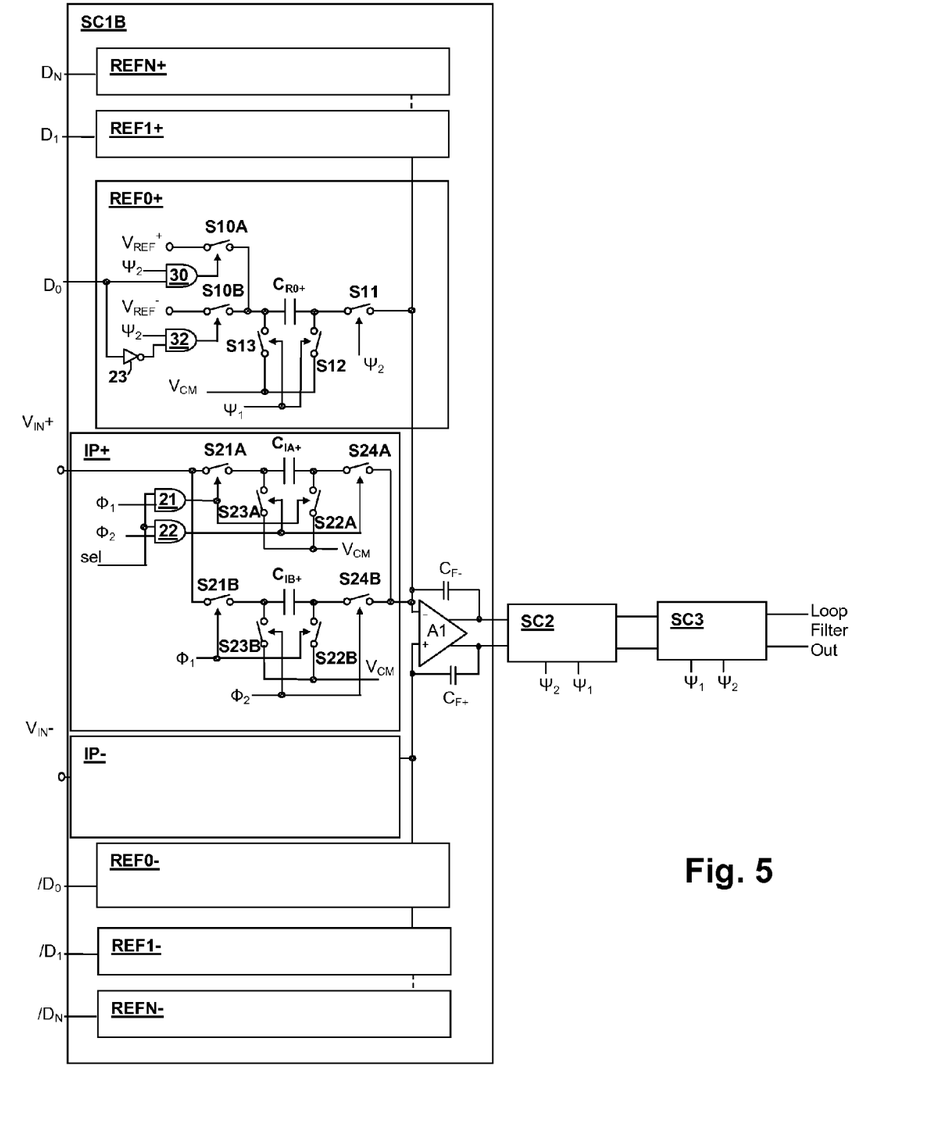
FIG. 5 is simplified schematic diagram depicting circuits that can be used to implement loop filter 15 of FIG. 1 in accordance with still another embodiment of the present invention.

Referring now to FIG. 5, circuits that may be used to implement analog loop filter 15 in accordance with still another embodiment of the present invention are shown. First switched-capacitor integrator SC1B is similar to switched-capacitor integrator SC1 of FIG. 3, so only differences between them will be described below. In switched-capacitor integrator SC1B, separate and identical reference circuits REF0+ through REFN+ and REF0− through REFN− are used to apply charge from reference voltages $V_{REF+}$ or $V_{REF−}$ according to the digital feedback values D0-DN or their complements /D0-/DN. In the lower quantization rate mode (sel=0), the application of too much (4×) reference charge is avoided by operating reference circuits REF0+ through REFN+ and REF0− through REFN− by clock phase signals $\Psi 1$ and $\Psi 2$, which in the exemplary embodiment are clocked at the quantization rate of delta-sigma modulator 10. Input circuits IP+ and IP−, which are identical, apply charge from the corresponding one of input signals $V_{IN+}, V_{IN−}$ to the corresponding feedback capacitor $C_{F−}$ and $C_{F+}$ and as in the combined input/reference circuits of FIG. 3, has two separate switching networks and input switching capacitors, formed respectively by switches S21A, S22A, S23A, S24A and capacitor $C_{IA+}$ and switches S21B, S22B, S23B, S24B and capacitor $C_{IB+}$.

Also, as in the above-described combined input/reference circuits depicted in FIG. 3, capacitor $C_{IA+}$ has a capacitance thrice that of capacitor $C_{IB+}$, and switches S21A, S22A, S23A, S24A are disabled by the operation of logical-AND gates 21 and 22 when control signal sel is de-asserted, selecting the lower quantization rate operating mode (sel=0). While operating reference circuits REF0+ through REFN+ and REF0− through REFN− by clock phase signals $\Psi 1$ and $\Psi 2$ provides a convenient way to avoid scaling the switched capacitor circuit that applies the reference while in the lower quantization rate mode, it is possible to provide separate reference circuits in which the capacitance value is selected by control signal sel in a manner similar to the combined input/reference circuits depicted in FIG. 3.

Figure 6:
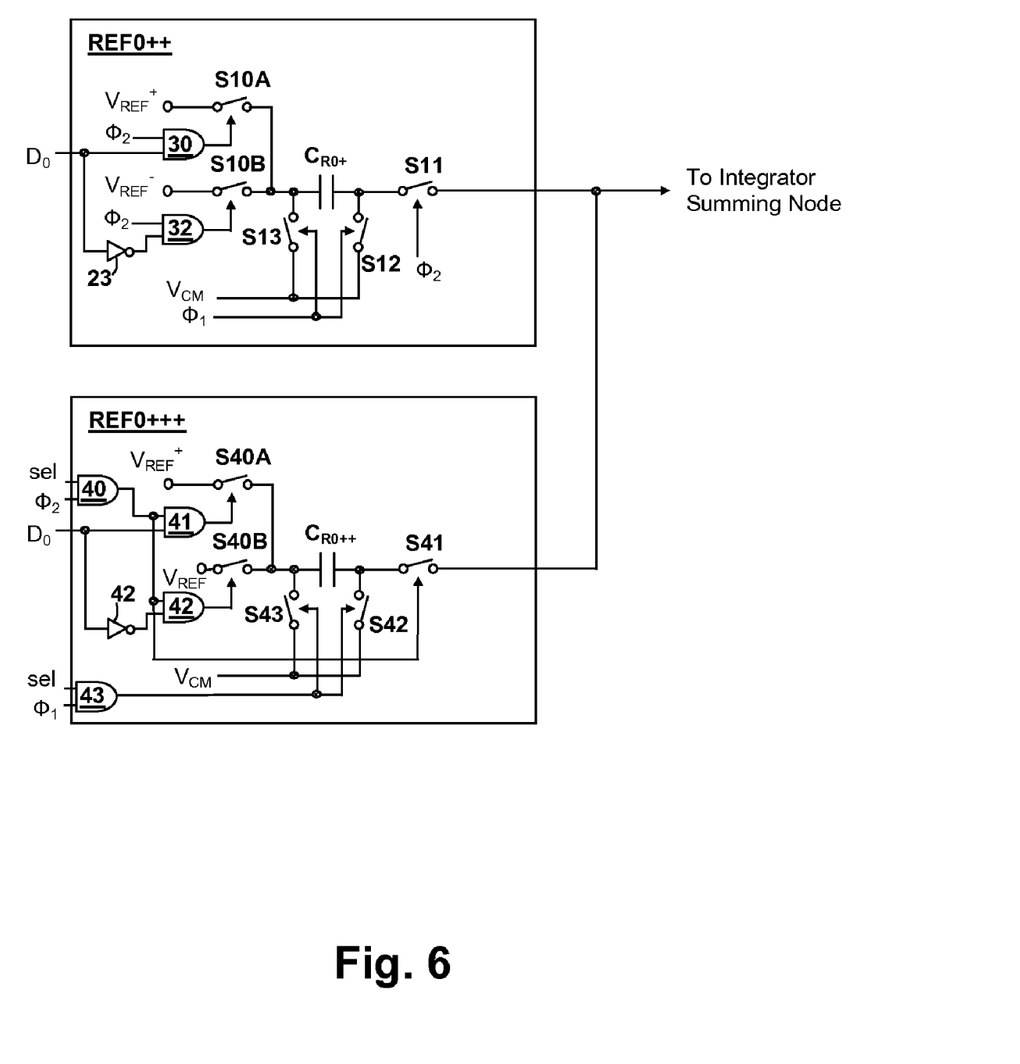
FIG. 6 is a simplified schematic diagram depicting an alternative reference feedback circuit that can be used within the circuit of FIG. 5 in accordance with an alternative embodiment of the present invention.

Referring now to FIG. 6, an alternative embodiment of reference circuits REF0+ through REFN+ and REF0− through REFN− of FIG. 5 is shown that may be used in an alternative embodiment of integrator SC1A of FIG. 4. In the depicted embodiment, a separate reference circuit REF0++ includes a switched-capacitor network identical to that of REF0+ in FIG. 5, except that reference circuit REF0++ is operated by clock phase signals $\Phi 1$ and $\Phi 2$. A second reference circuit REF0+++ formed by switches S40A, S40B, S41, S42, S43, and capacitor $C_{RO++}$ is operated only when control signal sel is asserted, i.e., in the higher quantization rate mode. Logical-AND gates 40-43 disable the application of clock phase signals $\Phi 1$ and $\Phi 2$ switches S40A, S40B, S41, S42 and S43. As in the other circuits described above, capacitor $C_{RO++}$ has a capacitance thrice that of capacitor $C_{RO+}$, so that the amount of charge injected for a given reference voltage and digital feedback signal combination is scaled according to operation of the quantizer at a lower quantization rate.

Figure 7:
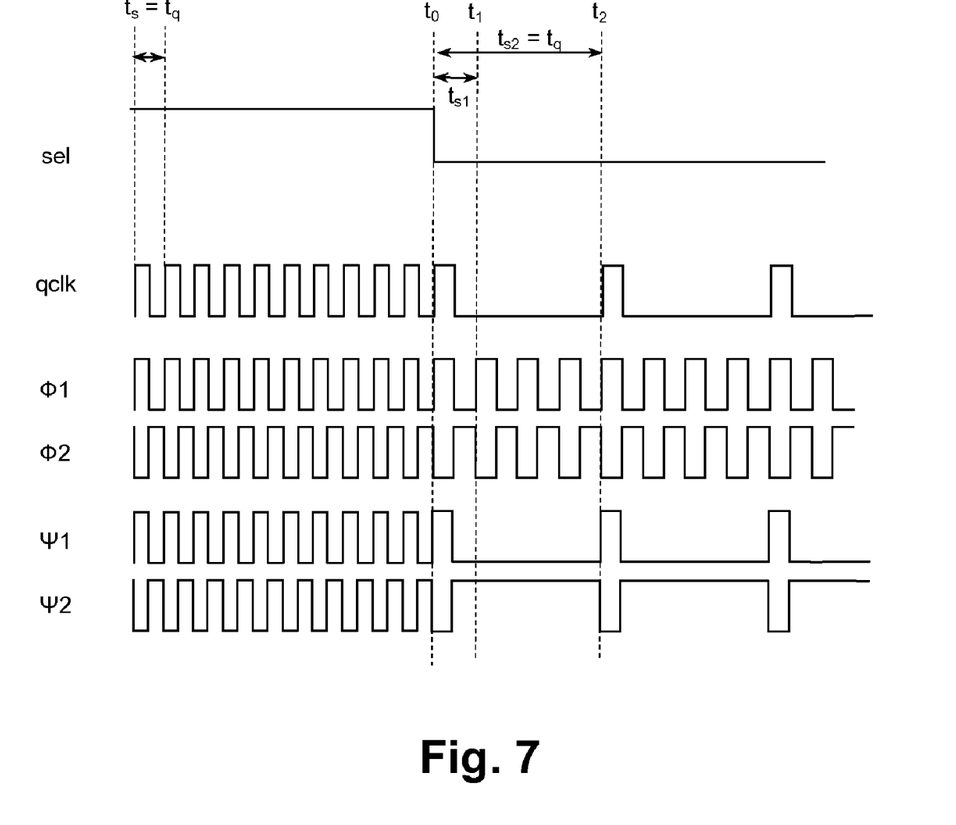
FIG. 7 is a timing diagram depicting signals within the circuits of FIG. 1 and FIGS. 3-6.

Referring now to FIG. 7, a timing diagram depicting operation of the circuits depicted in FIG. 1 and FIGS. 3-7 is shown. Before time $t_0$, control signal sel is asserted and the quantizer clock is 3 MHz, along with complementary clock phase signals $\Phi 1$ and $\Phi 2$ and complementary clock phase signals $\Psi 1$ and $\Psi 2$. Under those conditions, the sampling period $t_s$ of all of the integrators in the loop filter is equal to the quantization period $t_q$, as shown. After time $t_0$, control signal sel is de-asserted and the quantizer clock rate is reduced to 500 kHz, while the rate of complementary clock phase signals $\Phi 1$ and $\Phi 2$ is set to 2 MHz, yielding a first integrator sampling period $t_{s1}$ of 0.5 microseconds. Complementary clock phase signals $\Psi 1$ and $\Psi 2$ operate the remaining integrators at the quantizer clock rate of 500 kHz, yielding a sampling period $t_{s2}$ that is four times the length of first integrator sampling period $t_{s1}$.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A delta-sigma modulator circuit, comprising:
   a loop filter having an input for receiving an analog input signal, wherein the loop filter comprises a first switched-capacitor integrator operated by a first clock signal having a first switching rate and a second integrator having an input coupled to an output of the first switched-capacitor integrator;
   a quantizer having an input coupled to an output of the loop filter for generating a digital output value at a quantization rate of the delta-sigma modulator circuit, wherein the quantizer is operated by a quantizer clock;
   a feedback path from the output of the quantizer to the loop filter, whereby analog feedback is delivered to the loop filter according to the digital output value; and
   a control circuit for generating the first clock signal and the quantizer clock and wherein the quantizer clock has a selectable quantization rate selected according to a control signal, wherein the first clock signal has a first switching rate, and wherein the control circuit selects different ratios of the first switching rate to the quantization rate, according to the control signal.

2. The delta-sigma modulator circuit of claim 1, wherein the control signal changes a capacitance ratio of a feedback capacitance of the first switched-capacitor integrator to an input sampling capacitance of the first switched-capacitor integrator, whereby substantially the same response of the loop filter to the analog input signal is maintained when the different ratios of the first switching rate to the quantization rate are selected.

3. The delta-sigma modulator circuit of claim 2, wherein the control signal changes the capacitance ratio by selecting from among different values of a sampling capacitance of the first switched capacitor integrator.

4. The delta-sigma modulator circuit of claim 3, wherein in response to a first state of the control signal that selects a lower quantization rate, the sampling capacitance is provided by a first capacitor, and wherein in response to a second state of the control signal that selects a higher quantization rate, the sampling capacitance of the first integrator is increased by switching a second capacitor in parallel with the first sampling capacitor.

5. The delta-sigma modulator circuit of claim 2, wherein the control signal changes the capacitance ratio by selecting from among different feedback capacitance values for the first switched-capacitor integrator.

6. The delta-sigma modulator circuit of claim 1, wherein the control signal further changes an amount of charge injected into the first switched-capacitor integrator for a given magnitude of the analog input signal, whereby substantially the same response of the loop filter to the analog input signal is maintained when the different ratios of the first switching rate to the quantization rate are selected.

7. The delta-sigma modulator of claim 1, wherein the control signal further changes a response of the second integrator or another integrator of the loop filter other than the first switched-capacitor integrator, whereby substantially the same response of the loop filter to the analog input signal is maintained when the different ratios of the first switching rate to the quantization rate are selected.

8. The delta-sigma modulator circuit of claim 1, wherein the second integrator is a switched-capacitor integrator operated by a second clock signal at the quantization rate.

9. An analog-to-digital converter (ADC) circuit for converting an analog input signal to a digital ADC output, the ADC circuit, comprising:
a loop filter having an input for receiving an analog input signal, wherein the loop filter comprises a first switched-capacitor integrator operated by a first clock signal having a first switching rate and a second integrator having an input coupled to an output of the first switched-capacitor integrator;
a quantizer having an input coupled to an output of the loop filter for generating a digital output value at a quantization rate of the delta-sigma modulator circuit, wherein the quantizer is operated by a quantizer clock;
a feedback path from the output of the quantizer to the loop filter, whereby analog feedback is delivered to the loop filter according to the digital output value; and
a control circuit for generating the first clock signal and the quantizer clock and wherein the quantizer clock has a selectable quantization rate selected according to a control signal, wherein the first clock signal has a first switching rate, and wherein the control circuit selects different ratios of the first switching rate to the quantization rate according to the control signal; and
an output filter for filtering the digital output value to generate the digital ADC output.

10. The ADC circuit of claim 9, wherein the control signal changes a capacitance ratio of a feedback capacitance of the first switched-capacitor integrator to an input sampling capacitance of the first switched-capacitor integrator, whereby substantially the same response of the loop filter to the analog input signal is maintained when the different ratios of the first switching rate to the quantization rate are selected.

11. The ADC circuit of claim 10, wherein the control signal changes the capacitance ratio by selecting from among different values of a sampling capacitance of the first switched capacitor integrator.

12. The ADC circuit of claim 11, wherein in response to a first state of the control signal that selects a lower quantization rate, the sampling capacitance is provided by a first capacitor, and wherein in response to a second state of the control signal that selects a higher quantization rate, the sampling capacitance of the first integrator is increased by switching a second capacitor in parallel with the first sampling capacitor.

13. The ADC circuit of claim 10, wherein the control signal changes the capacitance ratio by selecting from among different feedback capacitance values for the first switched-capacitor integrator.

14. The ADC circuit of claim 9, wherein the control signal further changes an amount of charge injected into the first switched-capacitor integrator for a given magnitude of the analog input signal, whereby substantially the same response of the loop filter to the analog input signal is maintained when the different ratios of the first switching rate to the quantization rate are selected.

15. The ADC circuit of claim 9, wherein the control signal further changes a response of the second integrator or another integrator of the loop filter other than the first switched-capacitor integrator, whereby substantially the same response of the loop filter to the analog input signal is maintained when the different ratios of the first switching rate to the quantization rate are selected.

16. The ADC circuit of claim 9, wherein the second integrator is a switched-capacitor integrator operated by a second clock signal at the quantization rate.

17. A method of operating a delta-sigma modulator circuit, comprising:
receiving an analog input signal at an input of a loop filter of the delta-sigma modulator circuit;
within the loop filter, integrating the analog input signal with a first switched-capacitor integrator clocked at a first clock rate according to a first clock signal;
quantizing an output of the loop filter to generate a digital output value at a quantization rate of the delta-sigma modulator circuit according to a quantizer clock;
supplying feedback according to the digital output value to the loop filter; and
generating the first clock signal and the quantizer clock such that quantizer clock has a selectable quantization rate selected according to a control signal, wherein the first clock signal has a first switching rate, and wherein the control circuit selects different ratios of the first switching rate to the quantization rate, according to the control signal.

18. The method of claim 17, further comprising changing a capacitance ratio of a feedback capacitance of the first switched-capacitor integrator to an input sampling capacitance of the first switched-capacitor integrator, whereby substantially the same response of the loop filter to the analog input signal is maintained when the different ratios of the first switching rate to the quantization rate are selected.

19. The method of claim 17, further comprising changing an amount of charge injected into the first switched-capacitor integrator for a given magnitude of the analog input signal in accordance with a state of the control signal, whereby substantially the same response of the loop filter to the analog input signal is maintained when the different ratios of the first switching rate to the quantization rate are selected.

20. The method of claim 17, wherein the control signal further changes a response of another integrator of the loop filter other than the first switched-capacitor integrator, whereby substantially the same response of the loop filter to the analog input signal is maintained when the different ratios of the first switching rate to the quantization rate are selected by the selecting.

21. An analog-to-digital converter (ADC) circuit for converting an analog input signal to a digital ADC output, the ADC circuit, comprising:
a loop filter having an input for receiving an analog input signal, wherein the loop filter comprises a first switched-capacitor integrator operated by a first clock signal having a first sampling rate that samples the analog input signal at the first sampling rate using a first capacitor and samples a reference voltage having a polarity selected according to a digital feedback signal at a second sampling rate that is a lower sub-multiple of the first switching rate; and a quantizer having an input coupled to an output of the loop filter for generating a digital output value at a quantization rate equal to the second sampling rate; and an output filter for filtering the digital output value to generate the digital ADC output.

22. The ADC circuit of claim 21, further comprising a control circuit for selecting different ratios of the first switching rate to the quantization rate.

* * * * *